United States Patent
Sabathil et al.

(10) Patent No.: US 8,406,265 B2
(45) Date of Patent: Mar. 26, 2013

(54) OPTOELECTRONIC COMPONENT

(75) Inventors: Matthias Sabathil, Regensburg (DE);
Peter Brick, Regensburg (DE);
Christoph Eichler, Tegernheim (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/679,892

(22) PCT Filed: Aug. 29, 2008

(86) PCT No.: PCT/DE2008/001444
§ 371 (c)(1),
(2), (4) Date: Jun. 26, 2010

(87) PCT Pub. No.: WO2009/039814
PCT Pub. Date: Apr. 2, 2009

(65) Prior Publication Data
US 2010/0296538 A1 Nov. 25, 2010

(30) Foreign Application Priority Data

Sep. 24, 2007 (DE) .................. 10 2007 045 463
Dec. 7, 2007 (DE) .................. 10 2007 058 952

(51) Int. Cl.
*H01S 5/00* (2006.01)
*H01S 3/091* (2006.01)

(52) U.S. Cl. ............... 372/45.01; 372/43.01; 372/50.1; 372/75

(58) Field of Classification Search ............... 372/50.1, 372/50.21, 69–70, 75, 43.01, 45.01
See application file for complete search history.

(56) References Cited

U.S. PATENT DOCUMENTS

| 5,301,204 | A | 4/1994 | Cho et al. |
| 5,796,771 | A | 8/1998 | DenBaars et al. |
| 6,239,901 | B1 | 5/2001 | Kaneko |
| 6,954,479 | B2 | 10/2005 | Albrecht |
| 7,335,922 | B2 | 2/2008 | Plaine et al. |
| 7,826,511 | B1* | 11/2010 | Yap et al. ............ 372/75 |
| 2002/0171919 | A1 | 11/2002 | Blauvelt et al. |
| 2003/0026312 | A1* | 2/2003 | Clayton et al. ............ 372/50 |
| 2005/0058171 | A1* | 3/2005 | Albrecht ............ 372/50 |
| 2005/0169340 | A1* | 8/2005 | Anikitchev et al. ............ 372/75 |
| 2007/0133642 | A1* | 6/2007 | Park et al. ............ 372/50.124 |
| 2008/0080582 | A1 | 4/2008 | Karnutsch et al. |

FOREIGN PATENT DOCUMENTS

| CN | 1574519 | 2/2005 |
| DE | 101 29 616 | 1/2003 |
| DE | 10345555 | 5/2005 |
| DE | 1020042146 | 1/2006 |
| DE | 102004042146 | 1/2006 |

(Continued)

*Primary Examiner* — Jessica Stultz
*Assistant Examiner* — Phillip Nguyen
(74) *Attorney, Agent, or Firm* — Cozen O'Connor (57) ABSTRACT

An optoelectronic component (1) is specified, comprising a semiconductor body (2) with a semiconductor layer sequence. The semiconductor layer sequence of the semiconductor body (2) comprises a pump region (3) provided for generating a pump radiation and an emission region (4) provided for generating an emission radiation. The emission region (4) and the pump region (3) are arranged one above the other. The pump radiation optically pumps the emission region (4) during operation of the optoelectronic component (1). The emission radiation emerges from the semiconductor body (2) with the semiconductor layer sequence in a lateral direction during operation of the optoelectronic component (1).

15 Claims, 8 Drawing Sheets

FOREIGN PATENT DOCUMENTS

| | | |
|---|---|---|
| DE | 102005048196 | 2/2007 |
| EP | 1 035 623 A1 | 9/2000 |
| EP | 1 615 306 | 1/2006 |
| JP | 03-126931 | 5/1991 |
| JP | 2002-261334 | 9/2002 |
| JP | 2004-179493 | 6/2004 |
| WO | WO 2007/094928 A1 | 8/2007 |

* cited by examiner

OPTOELECTRONIC COMPONENT

RELATED APPLICATIONS

This is a U.S. national stage of application No. PCT/DE2008/001444 filed Aug. 29, 2008.

This patent application claims the priority of German patent application nos. 102007045463.7 filed Sep. 24, 2007 and 102007058952.4 filed Dec. 7, 2007,

FIELD OF THE INVENTION

The present application relates to an optoelectronic component.

BACKGROUND OF THE INVENTION

In the case of semiconductor laser diodes based on nitridic compound semiconductors, the efficiency of the generation of radiation usually decreases with increasing wavelength. This makes it more difficult to generate radiation in the green spectral range. Hitherto, therefore, green laser radiation has often been generated by laser radiation in the infrared spectral range being frequency-doubled by means of nonlinear-optical crystals. This is associated with a comparatively high outlay in respect of alignment and assembly. Additional factors include the costs for such crystals and comparatively low conversion efficiencies.

SUMMARY OF THE INVENTION

One object is to specify an optoelectronic component whose emission radiation lies in a spectral range which cannot directly be covered by conventional semiconductor laser diodes.

In accordance with one embodiment, the optoelectronic component comprises a semiconductor body with a semiconductor layer sequence, wherein the semiconductor layer sequence comprises a pump region provided for generating a pump radiation and an emission region provided for generating an emission radiation. The pump region and the emission region are arranged one above the other. The pump radiation optically pumps the emission region during operation of the optoelectronic component. The emission radiation emerges from the semiconductor body in a lateral direction during operation of the optoelectronic component. By means of the pump radiation, radiation whose peak wavelength lies in a spectral range that is difficult for conventional semiconductor laser diodes to attain can be generated in a simplified manner in the emission region. The radiation generated in the emission region is preferably coherent.

The pump region is preferably electrically pumped during operation of the optoelectronic component. Electrical power is therefore converted at least partly into optical power in the form of the pump radiation and subsequently into emission radiation.

The emission radiation and the pump radiation preferably propagate in a lateral direction. Therefore, the pump radiation, in the same way as the emission radiation, may run in a lateral direction in the semiconductor body. In this case, a lateral direction is understood to mean a direction which runs in a main extension plane of the semiconductor layers of the semiconductor layer sequence. Furthermore, the emission region and the pump region may be arranged in a common wave guide.

In one preferred development, the emission region and the pump region are arranged between two cladding layers. The cladding layers furthermore preferably each have a refractive index that is lower than those of the semiconductor layers respectively arranged on that side of the cladding layers which faces the pump region and the emission region. The cladding layers may thus bring about a simultaneous transverse wave guidance of the pump radiation and of the emission radiation.

In one preferred configuration, during operation of the optoelectronic component, charge carriers of one charge type, that is to say electrons or holes, are injected into the pump region through the emission region. Preferably, a first contact layer and a second contact layer are provided for the injection of charge carriers, wherein the emission region and the pump region are arranged between said contact layers. By virtue of arranging the emission region between the first contact layer and the second contact layer, the optoelectronic component may be embodied particularly compactly. Furthermore, an optical coupling of the emission region to the pump radiation is simplified.

A peak wavelength of the emission radiation is expediently greater than a peak wavelength of the pump radiation. An efficient absorption of the pump radiation in the emission region is thus ensured.

In one configuration variant, the peak wavelength of the emission radiation and/or the peak wavelength of the pump radiation lies in the ultraviolet or in the visible spectral range. By way of example, the peak wavelength of the pump radiation may lie in the blue or ultraviolet spectral range and the emission radiation in the green spectral range. The green spectral range is understood to mean, in particular, the range between 490 nm and 570 nm inclusive. The ultraviolet spectral range comprises approximately the wavelength range from 1 nm to 380 nm.

Furthermore, the peak wavelength of the emission radiation may be between 480 nm and 600 nm inclusive.

The emission region and/or the pump region preferably contains a III-V semiconductor material. In particular, the emission region and/or the pump region may contain $Al_xIn_yGa_{1-x-y}N$ where $0 \leq x \leq 1$, $0 \leq y \leq 1$ and $x+y \leq 1$. This semiconductor material is particularly suitable for the generation of radiation in the ultraviolet and visible, in particular blue and green, spectral range.

In an alternative configuration variant, the peak wavelength of the emission radiation and/or the peak wavelength of the pump radiation lie in the infrared or red spectral range. Particularly for the generation of radiation in the red and infrared spectral range, the emission region and/or the pump region may contain $Al_xIn_yGa_{1-x-y}Sb$, $Al_xIn_yGa_{1-x-y}As$ or $Al_xIn_yGa_{1-x-y}P$, in each case where $0 \leq x \leq 1$, $0 \leq y \leq 1$ and $x+y \leq 1$.

Alternatively or supplementarily, the emission region and/or the pump region may contain a III-V semiconductor material, for example InGaAsN, having a nitrogen content of at most 5%. Semiconductor materials of this type are also referred to as "dilute nitrides".

In one preferred configuration, the emission region and/or the pump region comprises a quantum structure. In the context of the application, the designation quantum structure encompasses in particular any structure in which charge carriers may experience a quantization of their energy states as a result of confinement. In particular, the designation quantum structure does not include any indication about the dimensionality of the quantization. It thus encompasses, inter alia, quantum wells, quantum wires and quantum dots and any combination of these structures.

In one preferred development, a band gap of a semiconductor layer adjoining the quantum layer, for instance of a barrier layer between two adjacent quantum layers, corresponds to a semiconductor layer adjoining the quantum layer of the pump region. The quantum layers in the emission region and the pump region may therefore be adjoined by semiconductor material embodied in identical fashion in each case, in particular with regard to the material composition thereof. The formation of an emission region and of a pump region with high crystal quality is thus simplified.

In one preferred configuration, a charge carrier barrier is formed in the semiconductor body. The charge carrier barrier preferably has a higher transmissivity for one charge type than for the other charge type. The charge carrier barrier may therefore be embodied as a hole barrier or as an electron barrier. During electrical pumping of the pump region, it is thus possible to achieve, in an improved manner, the situation where the radiative recombination of electron-hole pairs takes place predominantly in the pump region.

A charge carrier barrier arranged in a semiconductor body region doped in n-conducting fashion or in a manner adjoining a semiconductor body region doped in n-conducting fashion is preferably embodied as a hole barrier.

Correspondingly, a charge carrier barrier arranged in a semiconductor body region doped in p-conducting fashion or in a manner adjoining a semiconductor body region doped in p-conducting fashion is preferably embodied as an electron barrier.

A hole barrier may be formed for example by means of a semiconductor layer whose valence band edge lies below the valence band edge of the adjoining semiconductor layers. Correspondingly, an electron barrier may be formed by means of a semiconductor layer whose conduction band edge lies above the conduction band edge of the adjoining semiconductor layers.

Alternatively, or supplementarily, the charge carrier barrier may be embodied as a tunneling barrier. Preferably, the tunneling barrier has a band gap that is greater than the band gap of the adjoining semiconductor material.

The tunneling barrier preferably has a thickness of at most 10 nm, particularly preferably of at most 5 nm, for example 2 nm. Charge carriers may overcome this tunneling barrier on account of the quantum mechanical tunnel effect. In this case, the tunneling probability is usually different for charge carriers of different conduction types. Therefore, the transmissivity is higher for one charge type, usually electrons, than for the other charge type.

In one preferred development, a further charge carrier barrier is arranged on that side of the pump region which is remote from the charge carrier barrier. In this case, expediently, the charge carrier barrier is embodied as a hole barrier and the further charge carrier barrier is embodied as an electron barrier, or vice versa. The recombination of electron-hole pairs may thus be restricted particularly efficiently to the pump region. The conversion efficiency of electrical power into pump radiation may thus be increased more substantially.

The charge carrier barrier may be formed between the pump region and the emission region. A recombination of injected charge carriers may thus be restricted to the pump region in a simplified manner. As an alternative, the charge carrier barrier may also be arranged on that side of the pump region which is remote from the emission region.

In one preferred configuration, the layer thicknesses of the semiconductor layers of the semiconductor layer sequence are embodied in such a way that a predefined proportion of the pump radiation optically couples to the emission region. In particular, the degree of coupling of the pump radiation to the emission region may be set by means of a suitable arrangement of the emission region relative to the optical mode of the pump radiation that is formed during operation of the optoelectronic component in a vertical direction.

In one configuration variant the emission region and the pump region are provided in a vertical, that is to say transverse direction in each case for operation in an optical mode of the same order. In particular, the emission region and the pump region may be provided in a vertical direction in each case for operation in the optical fundamental mode.

A distance between the emission region and the pump region is furthermore preferably set in such a way that a predefined proportion of the pump radiation couples optically to the emission region. The smaller the distance between the emission region and an intensity maximum of the optical mode, in particular the sole intensity maximum in the case of the optical fundamental mode, of the pump radiation, the stronger the optical coupling of the emission region to the pump radiation.

The emission region and the pump region may be provided in a vertical direction also for operation in transverse optical modes having mutually different orders. In particular, the emission region may be provided for operation in the fundamental mode and the pump region may be provided for operation in a first-order mode.

An n-th order optical mode is distinguished by a standing radiation field having n nodes. A node of the optical mode of the pump region and/or of the emission region may be formed in the region of an absorbent layer. An undesired absorption of the pump radiation and/or of the emission radiation in the absorbent layer may thus be reduced.

The semiconductor body preferably has a radiation passage area. The emission radiation and, if appropriate, also the pump radiation may pass, in particular collinearly, through the radiation passage area.

In one preferred configuration, a coupling-out layer is formed on the radiation passage area. The coupling-out layer may also be formed in multi-layered fashion. In particular, the coupling-out layer may be embodied as a Bragg mirror. By means of a Bragg mirror, the reflectivity for the emission radiation and the reflectivity for the pump radiation may be set in wide ranges separately from one another.

Preferably, the radiation passage area, in particular by means of the coupling-out layer, is embodied in such a way that it has a lower reflectivity for the emission radiation than for the pump radiation. In particular, the radiation passage area may have a reflectivity of at most 70%, preferably at most 50%, for the emission radiation and a reflectivity of at least 70% for the pump radiation. Particularly for the case where the pump radiation is not provided for coupling out of the optoelectronic component, the reflectivity for the pump radiation may also be 80% or more, preferably 90% or more.

In one preferred development, an area of the semiconductor body that lies opposite to the radiation passage area is embodied, for example by means of a reflection layer, in such a way that it has a reflectivity of at least 50% preferably at least 70%, particularly preferably at least 90%, for the emission radiation and for the pump radiation.

In one preferred development, a resonator for the emission radiation and/or for the pump radiation is formed by means of an external mirror. In this case, the emission radiation passes through a region of free propagation between the emission region and the external mirror.

The pump radiation and the emission radiation may furthermore propagate in resonators that are different from one another. In particular, the resonators may be embodied in a different fashion with regard to the resonator type and/or the resonator length. By way of example, the pump radiation may propagate in a linear resonator, while the emission radiation propagates in a ring resonator, or vice versa.

In a further preferred configuration, the optoelectronic component comprises a nonlinear-optical element. The nonlinear-optical element may be provided for frequency mixing, in particular for frequency multiplication, for instance frequency doubling of the emission radiation. Furthermore, the nonlinear-optical element may be arranged within the external resonator for the emission radiation. A conversion of the radiation emitted by the emission region, for example from the green spectral range into the ultraviolet spectral range, may thus be effected particularly efficiently.

In a further preferred configuration, the optoelectronic component comprises a radiation receiver. The radiation receiver preferably comprises a further semiconductor layer sequence. The layer construction of said further semiconductor layer sequence may at least partly correspond to the layer construction of the semiconductor layer sequence. In particular, the semiconductor layer sequence comprising the emission region and the pump region and the further semiconductor layer sequence of the radiation receiver may be produced, for example epitaxially, in a common deposition step and furthermore preferably emerge from a common semiconductor layer sequence. Production is thereby simplified. Furthermore, the semiconductor layer sequence comprising the emission region and the pump region and the further semiconductor layer sequence may be arranged on a common growth substrate for these semiconductor layer sequences.

By way of example, the intensity of the emission radiation and/or of the pump radiation may be monitored by means of the radiation receiver. An additional optoelectronic component may be dispensed with for this purpose.

In one preferred configuration, a lateral structuring is formed on or in the semiconductor body comprising the emission region and the pump region. By means of a lateral structuring of this type, monomode operation may be achieved for example in a lateral, that is to say longitudinal, direction. The lateral structure may be a DFB (distributed feedback) structure or a DBR (distributed Bragg reflector) structure, by way of example.

DETAILED DESCRIPTION OF THE DRAWINGS

Elements that are identical, of identical type and act identically are provided with identical reference symbols in the figures.

The figures are in each case schematic illustrations and therefore not necessarily true to scale. Rather, comparatively small elements and in particular layer thicknesses may be illustrated with an exaggerated size for clarification purposes.

Figure 1:
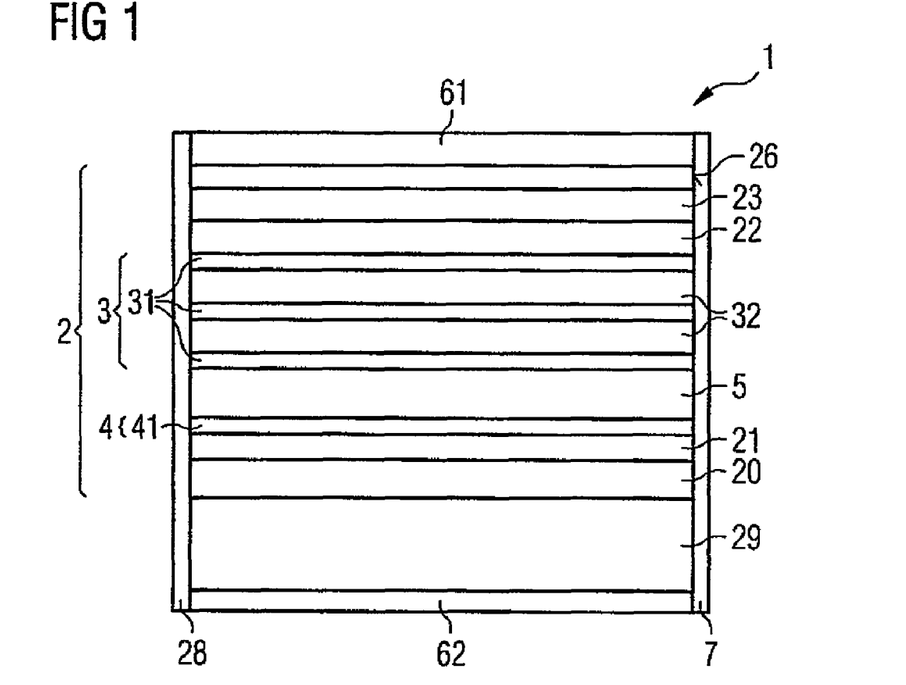
FIG. 1 shows a first exemplary embodiment of an optoelectronic component in schematic sectional view.

A first exemplary embodiment of an optoelectronic component 1 is illustrated in schematic sectional view in FIG. 1. The optoelectronic component 1 comprises a semiconductor body 2 comprising a semiconductor layer sequence. The semiconductor layer sequence forms the semiconductor body and is preferably produced epitaxially, for instance by means of MOVPE or MBE. The semiconductor layer sequence of the semiconductor body comprises a pump region 3 provided for generating a pump radiation and an emission region 4 provided for generating an emission radiation. The pump region and the emission region are arranged one above the other.

The pump radiation optically pumps the emission region 4 during operation of the optoelectronic component. The emission radiation thus generated emerges from the semiconductor body in a lateral direction. The emission radiation and the pump radiation propagate in a lateral direction.

The semiconductor body 2 comprising the semiconductor layer sequence is arranged on a carrier 29. The carrier may be, by way of example, a growth substrate for the semiconductor layer sequence of the semiconductor body 2. As an alternative, the carrier 29 may also be different from the growth substrate. In this case, the carrier does not have to satisfy the stringent requirements made of a growth substrate, in particular with regard to the crystalline purity, but rather may be chosen with regard to other properties such as thermal conductivity, electrical conductivity and/or mechanical stability.

The optoelectronic component 1 furthermore comprises a first contact layer 61 and a second contact layer 62. The first and second contact layers are arranged in such a way that during operation of the optoelectronic component, via said contact layers, charge carriers may be injected from different sides into the pump region 3 and generate radiation there by recombination of electron-hole pairs. The contact layers preferably each contain a metal, for instance Au, Ag, Ti, Pt, Al or Ni, or a metallic alloy comprising at least one of said metals.

The pump region 3 is therefore electrically pumped vertically, while the pump radiation that optically pumps the emission region 4 propagates in a lateral direction.

The pump region 3 comprises, by way of example, three quantum layers 31, between which a respective barrier layer 32 is arranged. A number of quantum layers that deviates from three, for instance one quantum layer, two quantum layers or four or more quantum layers may also be formed in the pump region.

Furthermore, the emission region 4 comprises one quantum layer 41. In a departure from this, the emission region may also comprise two or more quantum layers. The quantum layer or respectively the quantum layers of the emission region 4 are expediently embodied in such a way that a transition energy of electron-hole pairs in the quantum layer of the emission region is less than a transition energy in the quantum layers 31 of the pump region 3. Pump radiation generated in the pump region may thus be efficiently absorbed in the emission region.

During operation of the optoelectronic component, charge carriers of one charge type are injected into the pump region 3 through the emission region 4. In the exemplary embodiment shown, the emission region is arranged in the injection path of the charge carriers from the second contact layer 62 into the pump region 3.

Expediently, the semiconductor layers are doped at least partly in n-conducting fashion on one side of the pump region and are doped at least partly in p-conducting fashion on the other side of the pump region. The injection of charge carriers into the pump region from two different sides of the pump region is thus simplified.

By way of example, an n-conducting semiconductor layer 21 and an n-conducting cladding layer 20 may be arranged between the pump region 4 and the carrier 29. Correspondingly p-doped semiconductor layers 22, 24 and also a p-conducting cladding layer 23 may be arranged on that side of the pump region 4 which is remote from the carrier. The cladding layers expediently have a refractive index that is lower than the refractive index of the semiconductor layers arranged between the cladding layers. The emission region and the pump region are arranged between said cladding layers. A common transverse wave guidance of the pump radiation and of the emission radiation between the cladding layers is thus simplified.

The emission region 4 and the pump region 3 are preferably at least partly arranged in a semiconductor body region doped in identical fashion. In particular, it is possible to arrange the emission region completely and the pump region completely or at least partly in a region doped in n-conducting fashion.

The semiconductor layers of the emission region 4 and of the pump region 3 may be varied in wide limits with regard to their material composition.

Preferably, the emission region 4 and/or the pump region 3 contains a III-V compound semiconductor material. In particular a nitridic compound semiconductor material preferably based on the material composition $Al_xIn_yGa_{1-x-y}N$ where $0 \leq x \leq 1$, $0 \leq y \leq 1$ and $x+y \leq 1$, is suitable for the generation of green emission radiation. An exemplary material composition for the layer construction illustrated in FIG. 1 is shown in table 1, where the emission region is provided for the generation of radiation in the green spectral range, for instance at 532 nm.

TABLE 1

| Layer | Material composition | Layer thickness |
|---|---|---|
| First contact layer 61 | Au | 1000 nm |
| Semiconductor layer 24 | GaN | 100 nm |
| Cladding layer 23 | $Al_{0.06}Ga_{0.94}N$ | 600 nm |
| Semiconductor layer 22 | GaN | 88.58 nm |
| Quantum layer 31 | $In_{0.051}Ga_{0.949}N$ | 4 nm |
| Barrier layer 32 | GaN | 8 nm |

TABLE 1-continued

| Layer | Material composition | Layer thickness |
|---|---|---|
| Quantum layer 31 | $In_{0.051}Ga_{0.949}N$ | 4 nm |
| Barrier layer 32 | GaN | 8 nm |
| Quantum layer 31 | $In_{0.051}Ga_{0.949}N$ | 4 nm |
| Interlayer 5 | GaN | 279.11 nm |
| Quantum layer 41 of the emission region 4 | $In_{0.10}Ga_{0.90}N$ | 2 nm |
| Semiconductor layer 21 | GaN | 420.83 nm |
| Cladding layer 20 | $Al_{0.06}Ga_{0.94}N$ | 2000 nm |
| Carrier | GaN | 90 μm |
| Second contact layer 62 | Au | 1000 nm |

In this case, the peak wavelength of the emission radiation may be set by means of a suitable combination of the thickness of the quantum layer 41 of the emission region 4 and the In content thereof, wherein the peak wavelength may be increased by increasing the In content and/or by increasing the layer thickness. By way of example, an InGaN quantum layer 41 having an indium content y of 10% and a thickness of 2 nm is suitable for the generation of emission radiation having a wavelength of approximately 532 nm. The semiconductor layers 21, 5 adjoining said quantum layer 41 are each based on GaN and thus have a band gap that is greater than that of the quantum layer 41. The emission region may also comprise more than one quantum layer, the quantum layers preferably being embodied in identical fashion.

In this case, quantum layers having a thickness of 4 nm and an indium content y of approximately 5.1% are suitable for the quantum layers 31 of the pump region 3. The barrier layers 32 are in turn based on GaN, that is to say have the same composition as the semiconductor layers 21, 5 adjoining the quantum layer 41 of the emission region 4. The pump region comprises three quantum layers 31. In a departure from this, however, a quantum structure comprising only one, two or more than three quantum layers may also be provided.

The quantum layers 31 of the pump region 3 therefore have a lower indium concentration than the quantum layer 41 of the emission region 4. The injection of charge carriers into the quantum layers of the pump region 3 is thus simplified, particularly compared with the injection into the quantum layers of the emission region 4.

The reason why injection of charge carriers into the quantum layers is made more difficult as the indium content increases is piezoelectric fields that form at an InGaN/GaN interface. The higher the In content, the stronger said piezoelectric fields.

By means of the electrically pumped pump region 3 and the emission region 4 optically pumped by the latter, radiation in a wavelength range, for example in the green wavelength range, may thus be generated in a simple manner by the application of an external electrical voltage. It is thus possible to generate coherent radiation, for instance laser radiation, in the green spectral range, wherein conversion in a nonlinear-optical crystal can be dispensed with. The green coherent radiation is therefore generated while still within the electrically pumped semiconductor body 2.

An interlayer 5 is arranged between the pump region 3 and the emission region 4. An optical coupling between the pump radiation and the emission region 4 may be set by means of said interlayer. The thickness of the interlayer is preferably between 1 nm and 2 μm inclusive, particularly preferably between 5 nm and 1 μm inclusive. This will be explained in greater detail in connection with FIGS. 6A to 6C.

Other emission wavelengths may also be generated by setting the layer thicknesses and/or the material composition.

The peak wavelength of the emission radiation preferably lies between 480 nm and 600 nm inclusive. The peak wavelength of the pump radiation preferably lies in the blue or ultraviolet spectral range.

The pump region 3 and the emission region 4 are arranged between two cladding layers 23, 20, which each contain $Al_{0.06}Ga_{0.94}N$ and thus have a lower refractive index than the GaN semiconductor layers arranged between said cladding layers 20, 23, for instance the barrier layers 32 of the pump region 3 or the semiconductor layers 21 and 22 adjoining the cladding layers 20 and 23 respectively on the part of the emission region and the pump region.

In a departure from the described material composition of the layer sequence, the emission region and/or the pump region may contain a different semiconductor material, in particular a ITT-V semiconductor material. By way of example, the emission region and/or the pump region may contain $Al_xIn_yGa_{1-x-y}Sb$, $Al_xIn_yGa_{1-x-y}As$ or $Al_xIn_yGa_{1-x-y}P$, in each case where $0 \leq x \leq 1$, $0 \leq y \leq 1$ and $x+y \leq 1$. A III-V semiconductor material, for example $In_yGa_{1-y}As_{1-z}N_z$ having a nitrogen content z of at most 5% may also be employed. Through a suitable choice of the semiconductor materials and the semiconductor layer thicknesses, it is thus possible to set the emission radiation in wide ranges from the ultraviolet through the visible right into the near or intermediate infrared range. By way of example, an emission region which is provided for radiation emission in the mid infrared may be optically pumped by means of a pump region that emits in the near infrared.

The semiconductor body 2 comprising the semiconductor layer sequence has a radiation passage area 26. The radiation passage area runs obliquely or perpendicularly to a main extension direction of the semiconductor layers of the semiconductor layer sequence of the semiconductor body 2 and thus delimits the semiconductor body in a lateral direction.

The radiation passage area 26 may be produced for example by means of cleavage or breaking or by means of etching, for instance wet-chemical or dry-chemical etching.

A coupling-out layer 7 is formed on the radiation passage area 26, by means of which coupling-out layer the reflectivity for the emission radiation and/or the pump radiation is adapted to a predefined value or to a predefined spectral profile of the reflectivity. If appropriate, a coupling-out layer may also be dispensed with. In a departure from the exemplary embodiment shown, it is possible for the coupling-out layer 7 to not cover or only partly cover the contact layers 61, 62 and/or the carrier 29.

The coupling-out layer 7 may have a lower reflectivity for the emission radiation than for the pump radiation. By way of example, the coupling-out layer 7 may have a reflectivity of at most 70%, preferably at most 50%, for the emission radiation and a reflectivity of at least 70%, preferably at least 80%, particularly preferably at least 90% for the pump radiation. Particularly for the case where the pump radiation is not provided for coupling out from the semiconductor body 2, but rather exclusively for optically pumping the emission region 4, the coupling-out layer may also have a reflectivity of at least 80% preferably at least 90%, particularly preferably at least 95%, for the pump radiation.

A reflection layer 28 is formed on the opposite side of the semiconductor body 2 with respect to the radiation passage area 26. The reflection layer preferably has a high reflectivity for the pump radiation and for the emission radiation. The reflectivity may be at least 50%, preferably at least 70%, particularly preferably at least 80%, most preferably at least 90%.

The pump radiation may also at least partly be provided for coupling out from the semiconductor body 2. In this case, a lower reflectivity of the coupling-out layer 7 for the pump radiation may also be expedient.

The optoelectronic component may therefore simultaneously provide the emission radiation and pump radiation, that is to say two radiation components having mutually different peak wavelengths, for example radiation in the blue and green spectral range. The emission radiation and the pump radiation may pass in particular collinearly through the radiation passage area. A complex superimposition of radiation components having different peak wavelengths may be dispensed with.

Furthermore, the coupling-out layer 7 may also be embodied in multilayered fashion. In particular, a Bragg mirror may be formed by means of a plurality of layers. The Bragg mirror is preferably formed by means of layers formed in dielectric fashion. For the emission radiation or for the pump radiation, the layers may have at least in part an optical layer thickness, that is to say layer thickness multiplied by refractive index, of approximately one quarter of the peak wavelength of the emission radiation or respectively the peak wavelength of the pump radiation.

The dielectric layers may be deposited on the, preferably prefabricated, semiconductor body 2. This may be effected by means of sputtering or vapor deposition, for example. The coupling-out layer 7 may contain for example an oxide, for instance $TiO_2$ or $SiO_2$, a nitride, for instance $Si_3N_4$, or an oxynitride, for instance silicon oxynitride. In particular, layer pairs comprising an $SiO_2$ layer and an $Si_3N_4$ layer are suitable for the coupling-out layer.

The features described for the coupling-out layer are also applicable to the reflection layer 28.

A lateral structuring may be formed on or in the semiconductor body 2 having the vertical structure described. By way of example, the lateral structuring may be embodied in accordance with the structuring of a DFB semiconductor laser or of a DBR semiconductor laser.

Figure 2:
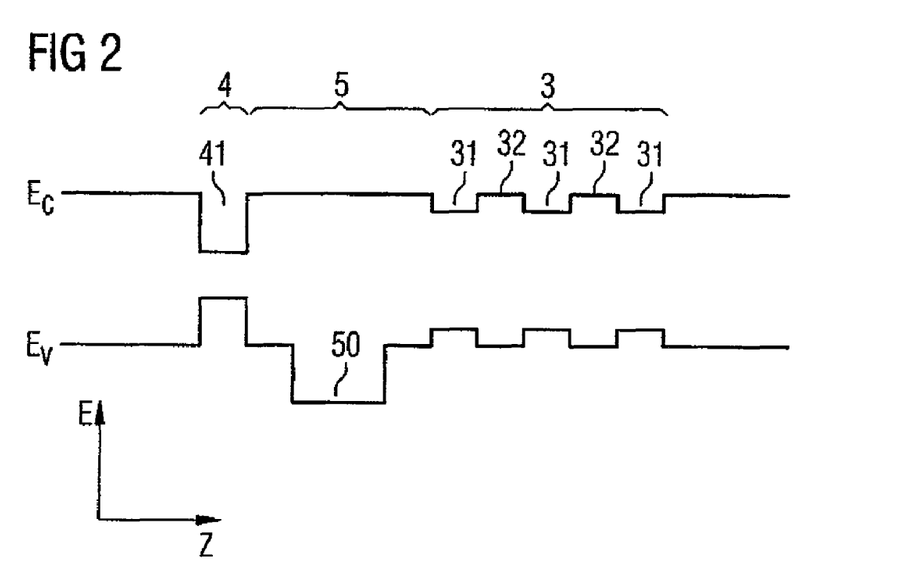
FIG. 2 shows a profile of conduction and valence band edges for an excerpt from a semiconductor body in accordance with a second exemplary embodiment of an optoelectronic component, FIGS. 3A and 3B respectively show a profile of conduction and valence band edges for an excerpt from a semiconductor body in accordance with a third exemplary embodiment (FIG. 3A) and a fourth exemplary embodiment (FIG. 3B) of an optoelectronic component.

A schematic profile of a conduction band edge $E_C$ and of a valence band edge $E_V$ in a partial region of the semiconductor body 2 that comprises the pump region 3 and the emission region 4 is illustrated for a second exemplary embodiment of an optoelectronic component in FIG. 2. This second exemplary embodiment substantially corresponds to the first exemplary embodiment described in connection with FIG. 1.

In this case, the z-direction plotted is perpendicular to a main extension direction of the semiconductor layers of the semiconductor layer sequence of the semiconductor body 2. The z-direction thus runs along a deposition direction of said semiconductor layers.

As described in connection with FIG. 1, the pump region 3 and the emission region 4 each comprise a quantum structure, wherein the pump region 3 comprises three quantum layers 31 and the emission region 4 comprises one quantum layer 41, by way of example. The energy difference between conduction band edge and valence band edge is smaller in the quantum layer 41 of the emission region 4 than in the quantum layers 31 of the pump region 3. Radiation generated by radiative recombination of electron-hole pairs in the quantum layers 31 of the pump region 3 may thus be absorbed in the emission region 4, in particular in the quantum layer 41. Coherent radiation having a peak wavelength greater than the peak wavelength of the pump radiation may thus be generated by recombination of electron-hole pairs in the emission region 4. The illustrated profiles of the conduction and valence band edges only schematically illustrate the nominal profile of the conduction and valence bands for the individual semiconductor layers. Changes to these profiles caused by interface effects are not taken into account in the highly simplified illustration.

In contrast to the exemplary embodiment described in connection with FIG. 1, a charge carrier barrier 50 is formed in the semiconductor body 2. The charge carrier barrier is arranged between the emission region 4 and the pump region 3.

The charge carrier barrier 50 is formed in the interlayer 5, wherein the charge carrier barrier contains a semiconductor material having a larger band gap than the adjoining semiconductor material. By way of example, the charge carrier barrier may be embodied in a GaN interlayer as an AlGaN charge carrier barrier having an aluminum content of between 10% and 30% inclusive, preferably between 15% and 25% inclusive. The thickness of the charge carrier barrier may be for example between 10 nm and 50 nm inclusive, for instance 20 nm.

The charge carrier barrier 50 has a valence band edge which lies at a lower energy level than the valence band edge of the adjoining semiconductor material. A current flow of holes from one side of the pump region 3 through the pump region as far as the emission region 4 may thus be avoided. A radiative recombination of charge carriers within the pump region 3 is promoted in this way. By contrast, the profile of the conduction band edge in the region of the charge carrier barrier 50 is at a constant level, such that electrons may pass through the charge carrier barrier unimpeded toward the pump region.

Figure 3A:
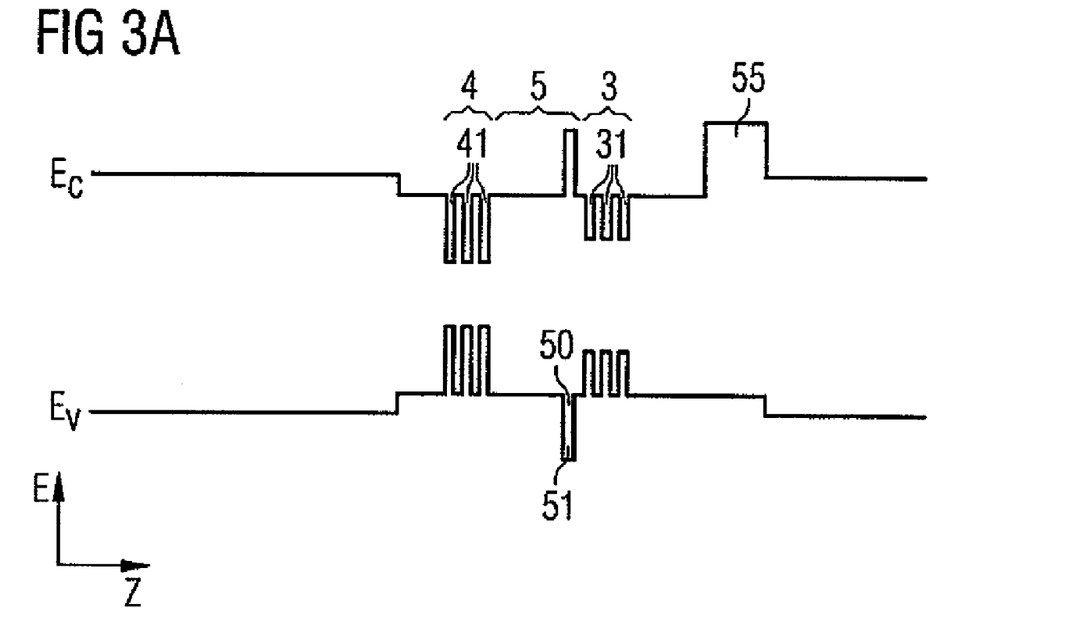
Figure 3B:
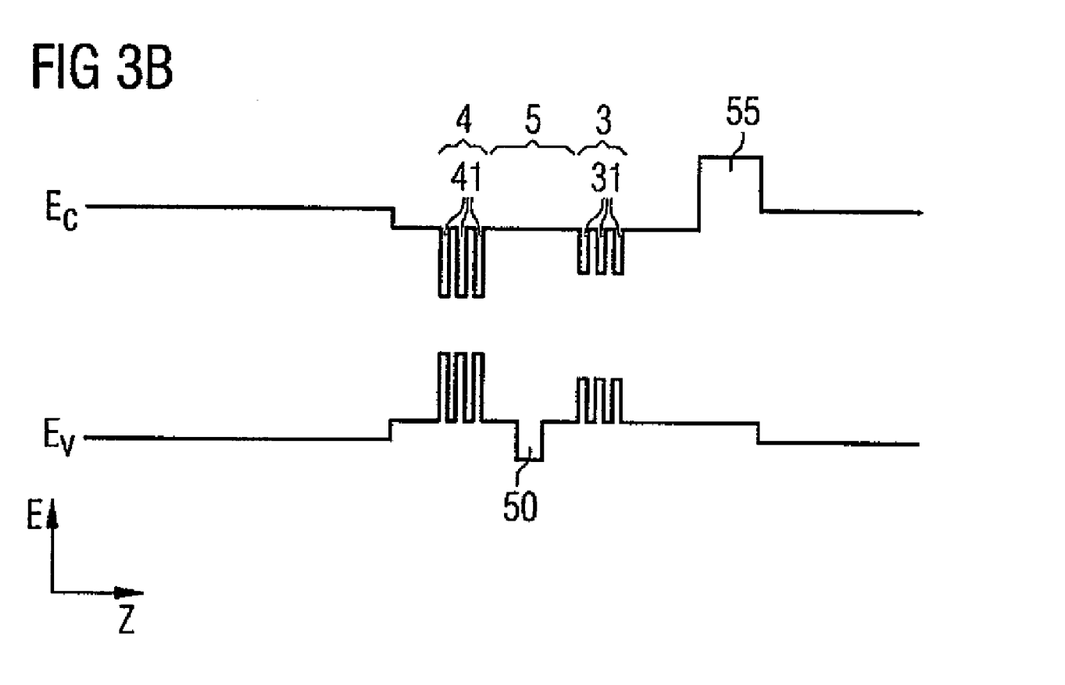

FIGS. 3A and 3B respectively illustrate a schematic profile of a conduction band edge $E_C$ and of a valence band edge $E_V$ in a partial region of the semiconductor body 2 that comprises the pump region 3 and the emission region 4 for a third and respectively for a fourth exemplary embodiment of an optoelectronic component. As in FIG. 2, the profiles only schematically illustrate the nominal profile of the conduction and valence bands for the individual semiconductor layers, wherein interface effects are not taken into account.

The third exemplary embodiment illustrated in FIG. 3A substantially corresponds to the second exemplary embodiment described in connection with FIG. 2.

In a departure from the second exemplary embodiment, the emission region 4 comprises three quantum layers 41, by way of example.

Furthermore in contrast to the second exemplary embodiment, a charge carrier barrier 50 embodied as a tunneling barrier 51 is formed between the pump region 3 and the emission region 4.

In the case of the tunneling barrier 51, the conduction band edge $E_C$ is at a higher energy level than in the adjoining semiconductor material. At the same time, the valence band edge $E_V$ is at a lower energy level than in the adjoining semiconductor material. The tunneling barrier preferably has a thickness of at most 10 nm, particularly preferably at most 5 nm, for instance 2 nm. In the case of an adjoining GaN semiconductor material, an AlGaN layer having an aluminum content of between 30% and 70% inclusive, for example, is suitable as a tunneling barrier.

In the case of a tunneling barrier embodied in this way, the transmission probability for holes is lower than that for electrons. The passage of holes may thus be impeded, while electrons may pass through the tunneling barrier substantially unimpeded. The tunneling barrier 51 thus constitutes a hole barrier.

A further charge carrier barrier 55, which is embodied as an electron barrier, is arranged on that side of the pump region 3 which is remote from the emission region 4. In this case, the electron barrier has a conduction band edge which is at a higher energy level than the conduction band edge of the adjoining semiconductor layers. By contrast, the profile of the valence band edge is substantially at the same energy level as in the adjoining semiconductor material, such that holes may pass through the electron barrier practically unimpeded toward the pump region 3.

By way of example, an AlGaN semiconductor layer having an aluminum content of between 10% and 30% inclusive, preferably between 15% and 25% inclusive, is suitable as an electron barrier adjoining GaN semiconductor material. The thickness of the electron barrier may be for example between 10 nm and 50 nm inclusive, for instance 20 nm.

The semiconductor body 2 thus comprises a respective charge carrier barrier for two different charge types. In this way, the radiative recombination of charge carriers injected into the semiconductor body may be limited to the pump region particularly efficiently.

In a departure from the exemplary embodiment shown, the charge carrier barrier 50 embodied as a hole barrier may also be dispensed with. In this case, therefore, the optoelectronic component comprises only an electron barrier.

The fourth exemplary embodiment—on which FIG. 3B is based—for an optoelectronic component substantially corresponds to the third exemplary embodiment described in connection with FIG. 3A. In contrast thereto, the charge carrier barrier 50 acting as a hole barrier is not embodied as a tunneling barrier. In this case, the hole barrier may be embodied in the manner described in connection with FIG. 2.

Figure 4:
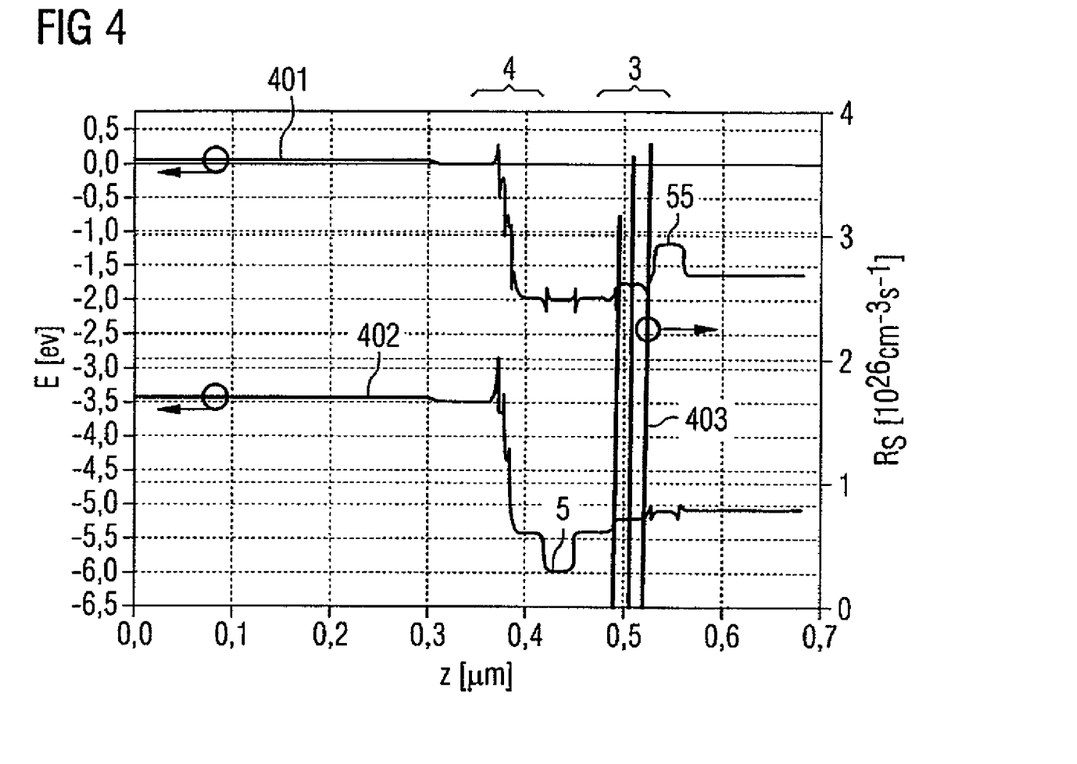
FIG. 4 shows results of a simulation of the vertical profile of conduction and valence band edges and of the rate for a radiative recombination $R_S$ in an excerpt from the semiconductor body in accordance with the fourth exemplary embodiment of the optoelectronic component, FIGS. 5A and 5B respectively show results of simulations of the emitted radiation power P as a function of the injected current I for exemplary embodiments of the optoelectronic component with different thermal resistances, FIGS. 6A to 6C respectively show a qualitative vertical profile of refractive index, optical mode of the pump radiation and optical mode of the emission radiation for three exemplary embodiments of the optoelectronic component.

FIG. 4 illustrates the result of a simulation of the profile of the conduction band edge 401 and of the valence band edge 402 for the fourth exemplary embodiment of the optoelectronic component as described in connection with FIG. 3B. Furthermore, the figure shows the profile of the radiative recombination $R_S$ 403 as a function of the location along the vertical direction z.

By means of the charge carrier barrier 50 and also the further charge carrier barrier 55, which in each case form a barrier for holes and electrons, respectively, the radiative recombination $R_S$ during the electrical pumping of the semiconductor body 2 may be restricted to the pump region particularly efficiently. This is shown by the profile 403 of the radiative recombination $R_S$, which has values that are different from zero only in the region of the quantum layers of the pump region 3.

In contrast to the illustration in FIG. 2 and in FIGS. 3A and 3B, interface effects such as piezoelectric fields are also taken into account in the simulated profiles of conduction band and valence band edges that are shown. This is manifested for example where the conduction band edge abruptly rises and directly thereafter falls at the interfaces between the indium-containing quantum layers of the emission region 4 and the adjoining semiconductor layers.

Figure 5A:
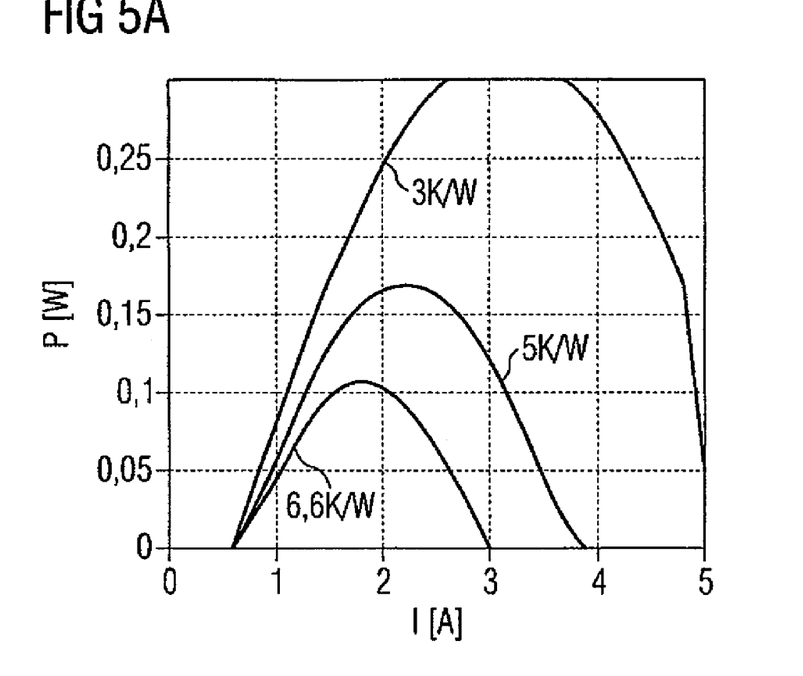
Figure 5B:
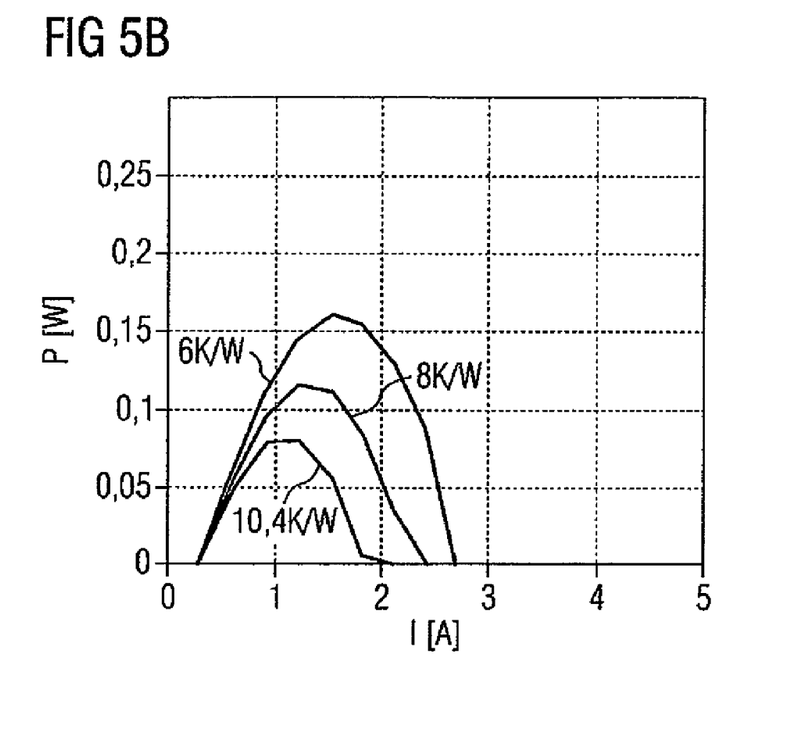

FIGS. 5A and 5B respectively show results of simulations of the output power P as a function of the injected current I for the thermal resistances specified. In this case, the emission region has a width of 20 μm for the curves illustrated in FIG. 5A and a width of 10 μm for the curves illustrated in FIG. 5B. In this case, the width relates to an extent of the emission region that runs in the main extension plane of the semiconductor layers of the semiconductor body and perpendicularly to the emission direction.

These simulations are based on a structure which is embodied in the manner described in connection with FIG. 1. The pump radiation lies in the ultraviolet spectral range, and the emission radiation lies in the green spectral range. On the part of the radiation passage area, a reflectivity of 90% for the ultraviolet spectral range and 10% for the green spectral range was taken as a basis. The reflectivity of an area of the semiconductor body which lies opposite to the coupling-out area and which likewise forms a resonator area is in each case a reflectivity of 90% for the green and the ultraviolet spectral range. In accordance with the simulations, the emission radiation may have a power of above 0.25 W given a thermal resistance of 3 K/W, FIGS. 6A to 6C respectively show results of simulations of the electromagnetic field 603, 613, 623 of the pump radiation and of the electromagnetic field 604, 614, 624 of the emission radiation in a vertical direction z.

Figure 6A:
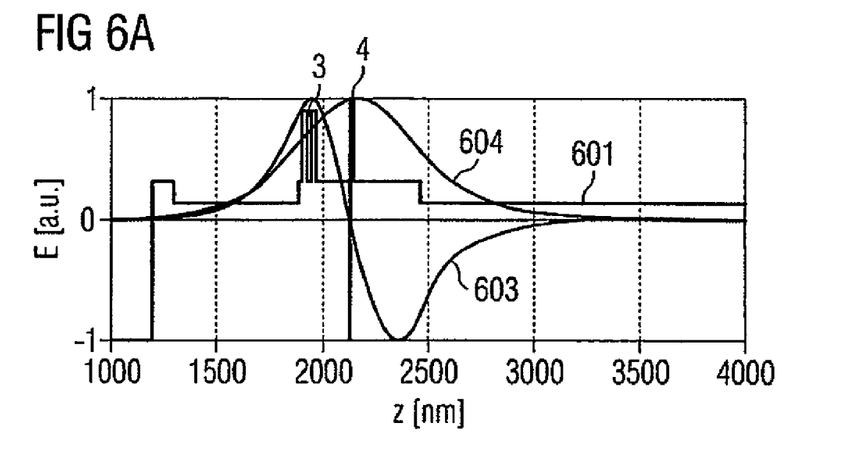
Figure 6B:
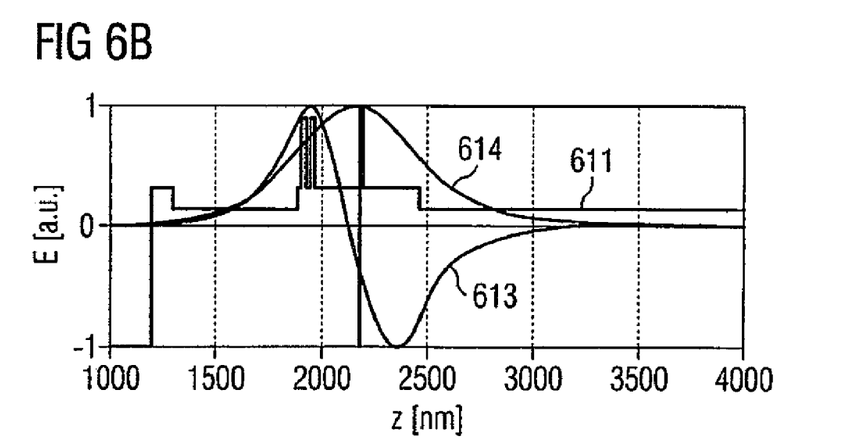
Figure 6C:
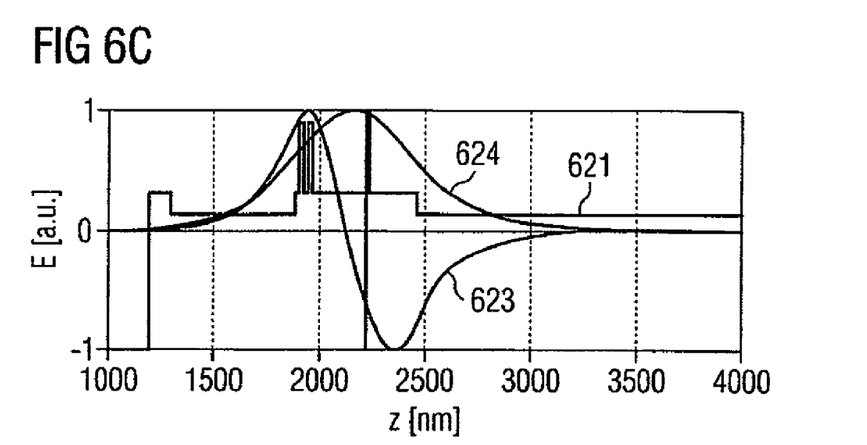

The field distributions are illustrated in normalized fashion in each case. Furthermore, the curves 601, 611 and 621 respectively show the qualitative profile of the refractive indices.

FIGS. 6A to 6C respectively show the case where the pump region 3 is provided for operation in the first-order optical mode. The emission region 4 is provided for operation in the optical fundamental mode.

The semiconductor layer sequences on which the simulation curves illustrated are based differ from one another in that the distance between the emission region 4 and the pump region 3 is varied. FIG. 6A illustrates the case where the emission region 4 is arranged near the node of the optical mode of the pump radiation. An optical coupling between the pump radiation and the emission region is thus comparatively small. As illustrated in FIGS. 6B and 6C, by varying the distance between the pump region and the emission region, by increasing the distance in the case shown, it is possible to increase the optical coupling between the pump radiation and the emission region. By means of a suitable choice of the layer thicknesses of the semiconductor layers of the semiconductor layer sequence, in particular by means of the distance between the pump region and the emission region, it is thus possible to set the strength of said optical coupling. The higher the optical coupling, the greater that proportion of the pump radiation which is absorbed in the emission region may be. The output power of the emission radiation may also be increased as a result.

Figure 7:
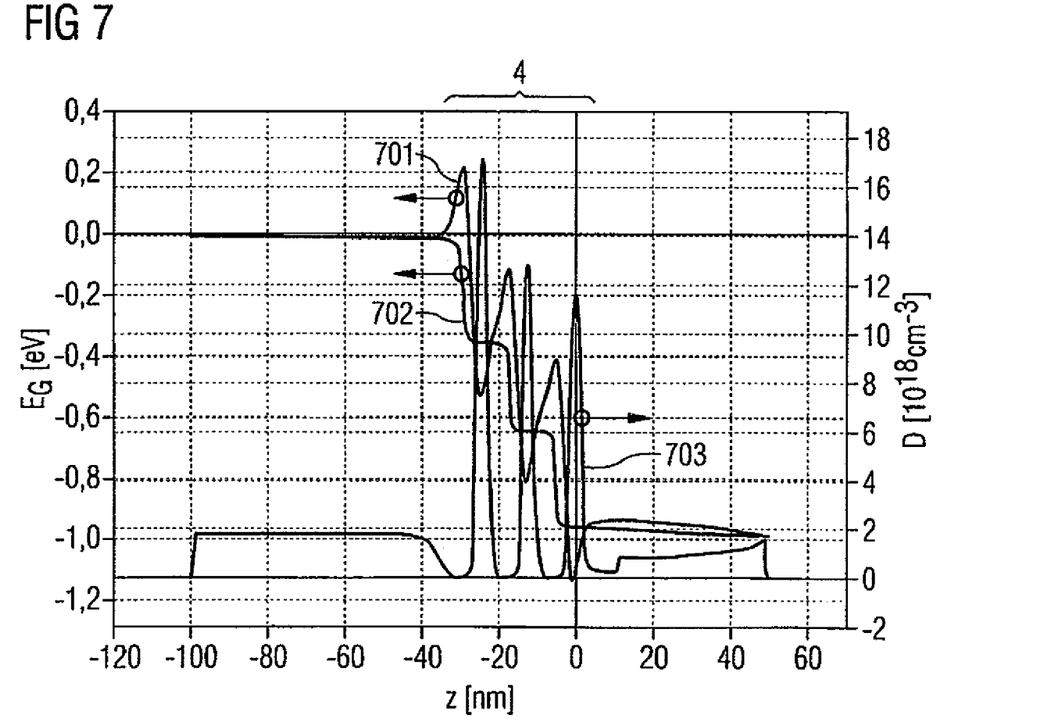
FIG. 7 shows results of a simulation of a conduction band edge profile, of a Fermi level, and of an electron density in a vertical direction for the fourth exemplary embodiment of the optoelectronic component.

FIG. 7 illustrates the results of simulations of the profile of the conduction band edge 701 and of the Fermi level 702 in a vertical direction. FIG. 7 furthermore shows the electron density distribution 703. The simulations are based in each case on the fourth exemplary embodiment—described in connection with FIG. 3B—of the optoelectronic component, on which FIG. 4 is also based.

Figure 8:
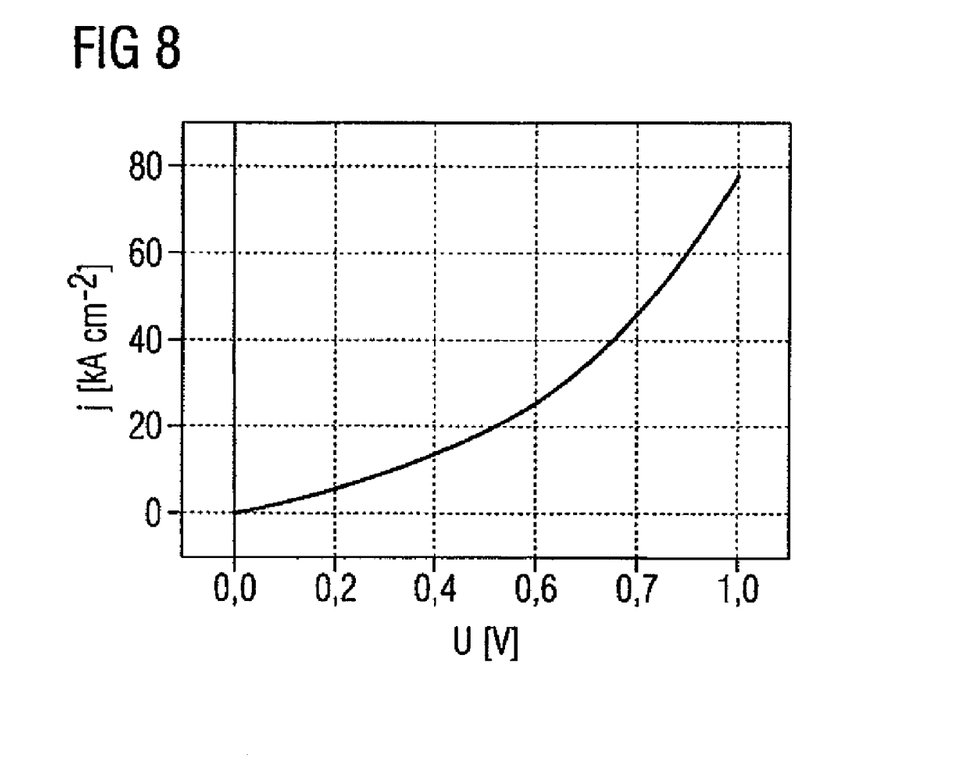
FIG. 8 shows a result of a simulation of the current density j as a function of the voltage U for the fourth exemplary embodiment (on which FIG. 7 is based) of the optoelectronic component.

The associated current density j as a function of the voltage drop U is shown in FIG. 8. The simulations show by way of example the influence of an emission region 4 comprising three quantum layers, wherein the quantum layers in each case have an indium content of 10%. Owing to the piezo-barriers that arise at the interfaces between the indium-containing quantum layers and the adjoining GaN layers, an additional voltage drop occurs, whereby the operating voltage of the optoelectronic component is increased.

As shown in FIG. 8, however, said additional voltage drop is only 1 V at a current density of 80 kA/cm$^2$. Therefore, despite the high indium content, the quantum layers of the emission region 4 only lead to a small increase in the operating voltage and thus do not lead to a significant impairment of the optoelectronic properties of the optoelectronic component.

Figure 9:
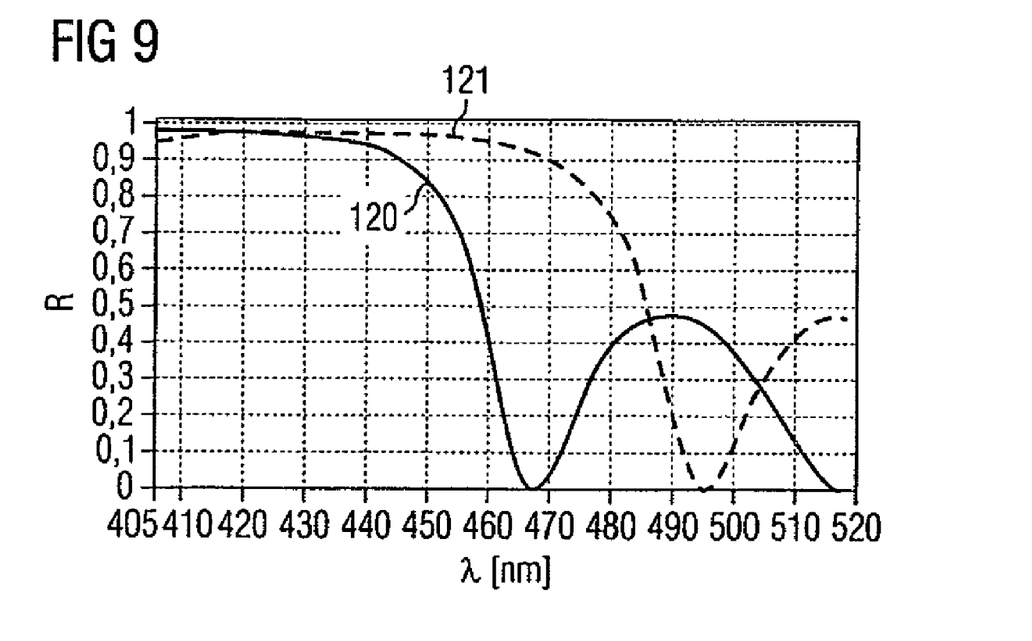
FIG. 9 shows results of simulations of the reflectivity R of a coupling-out layer as a function of the wavelength $\lambda$ for two exemplary embodiments of a coupling-out layer.

FIG. 9 illustrates results of simulations of the reflectivity R as a function of the wavelength λ for two different exemplary embodiments of the coupling-out layer. The coupling-out layers are in each case formed in multilayered fashion and embodied in the form of Bragg mirrors. The curves 120 and 121 illustrated have a very high reflectivity of at least 90% in each case in a wavelength range of 405 nm to 470 nm. At a wavelength of 520 nm, the reflectivity in the case of the curve 120 is close to 0%, while the reflectivity in the case of the curve 121 is approximately 50%. The simulations illustrated show that by varying the layer thicknesses of the Bragg mirror of the coupling-out layer, the radiation passage area may be embodied in such a way that it has a very high reflectivity for pump radiation in the blue or ultraviolet spectral range. At the same time, the reflectivity for the emission radiation may be set in a manner adapted to the requirements of the optoelectronic component over wide ranges.

Figure 10:
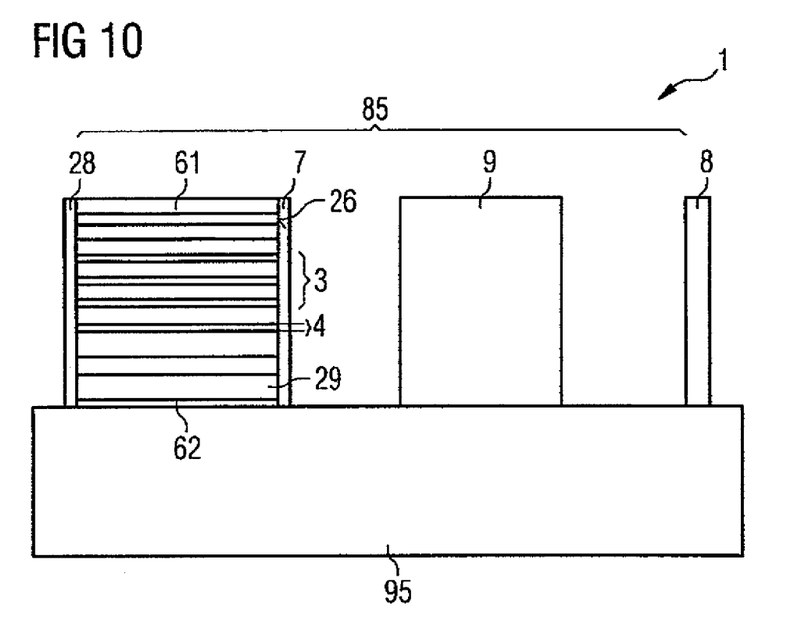
FIG. 10 shows a fifth exemplary embodiment of an optoelectronic component in schematic side view.

A fifth exemplary embodiment of an optoelectronic component is illustrated schematically in FIG. 10. In this case, the semiconductor body 2 with the semiconductor layer sequence may be embodied in particular in the manner described in connection with FIG. 1, 2, 3A or 3B. The optoelectronic component 1 illustrated comprises an external mirror 8 serving as an end mirror of the resonator 85. The resonator 85 is therefore embodied as an external resonator.

The semiconductor body 2 and the external mirror 8 are arranged on a mounting support 95 and are preferably mechanically stably connected thereto.

The external mirror 8 is spaced apart from the semiconductor body 2. The emission radiation therefore passes through a region of free propagation from the semiconductor body 2 to the external mirror 8. A nonlinear-optical element 9, for instance a nonlinear-optical crystal, may be arranged in said region of free propagation. By means of said nonlinear-optical element, the emission radiation and/or the pump radiation may be converted into radiation of other wavelengths by nonlinear-optical frequency mixing, in particular frequency multiplication, for instance frequency doubling. By way of example, green radiation having a wavelength of 532 nm may be frequency-doubled into ultraviolet radiation having a wavelength of 266 nm.

In the exemplary embodiment shown, the radiation passage area 26 of the semiconductor body may be embodied in such a way that it is highly reflective for the pump radiation and has a very low reflectivity, for instance 20% or less, preferably 10% or less, for the emission radiation. In this way, the radiation passage area 26 may constitute a resonator end area for the pump radiation, while the external mirror 8 forms the resonator end area for the emission radiation. The emission radiation and the pump radiation may therefore oscillate in resonators having different lengths. In a departure from the exemplary embodiment shown, the emission radiation may also oscillate in a different type of resonator, for instance a ring resonator. In this case, the side area of the semiconductor body which lies opposite to the radiation passage area 26 may have a comparatively low reflectivity, for instance 20% or less, preferably 10% or less, for the emission radiation.

Figure 11:
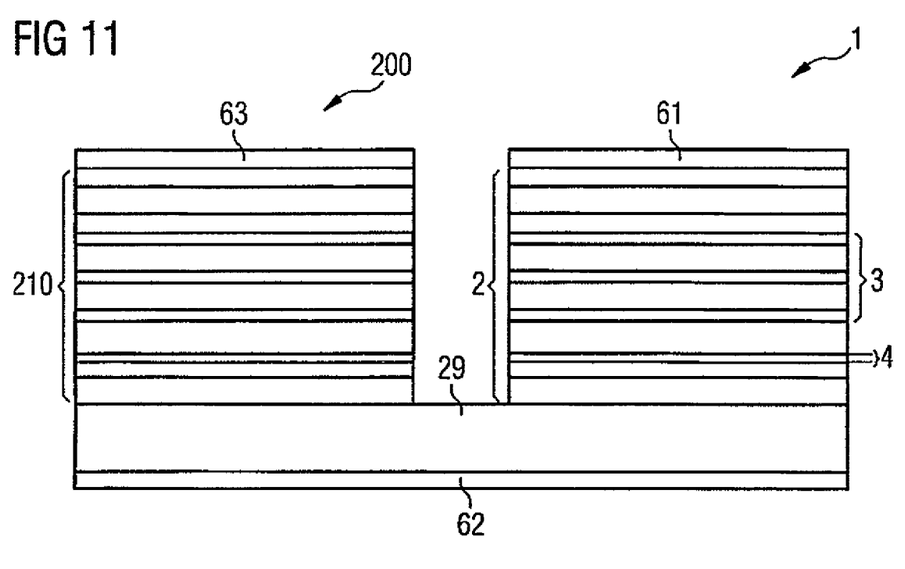
FIG. 11 shows a sixth exemplary embodiment of an optoelectronic component in schematic side view.

A sixth exemplary embodiment of an optoelectronic component is illustrated schematically in side view in FIG. 11. In addition to the semiconductor body 2 comprising the emission region 4 and the pump region 3, this optoelectronic component comprises a radiation receiver 200.

The said radiation receiver 200 comprises a further semiconductor layer sequence 210. The layer construction of this further semiconductor layer sequence, in particular the radiation-sensitive region thereof, at least partly corresponds to the layer construction of the semiconductor layer sequence comprising the emission region 4 and the pump region 3. The semiconductor layer sequence for the radiation receiver 200 and the semiconductor layer sequence comprising the pump region 3 and the emission region 4 may therefore be produced in a common deposition step, for instance by means of MOCVD or MBE.

The radiation receiver 200 and the semiconductor body 2 comprising the emission region and the pump region may be arranged on a common carrier 29, which may be formed by means of the growth substrate for the semiconductor layer sequence. In an optoelectronic component of this type, therefore, the emission region 4, the pump region and a radiation-sensitive region of a radiation receiver 200 may be monolithically integrated.

On the side remote from the carrier 29, the radiation receiver comprises a contact layer 63. The contact layer of the radiation receiver may be deposited together with the contact layer 61.

During operation of the optoelectronic component 1, a detection signal may be tapped off between the contact layer 63 and the second contact layer 62.

By way of example, the intensity of the emission radiation and/or of the pump radiation may be monitored by means of the radiation receiver 200. An additional optoelectronic component may be dispensed with for this purpose.

This patent application claims the priority of German Patent Applications 10 2007 045 463.7 and 10 2007 058 952.4, the disclosure content of which is hereby incorporated by reference.

The invention is not restricted by the description on the basis of the exemplary embodiments. Rather, the invention encompasses any novel feature and also any combination of features, which in particular comprises any combination of features in the patent claims, even if this feature or this combination itself is not explicitly specified in the patent claims or the exemplary embodiments.

The invention claimed is:

1. An optoelectronic component comprising
a semiconductor body with a semiconductor layer sequence,
wherein
the semiconductor layer sequence of the semiconductor body comprises a pump region provided for generating a pump radiation and an emission region provided for generating an emission radiation;
the pump region and the emission region are arranged one above the other;
the pump radiation optically pumps the emission region during operation of the optoelectronic component;
the emission radiation emerges from the semiconductor body in a lateral direction extending in a main extension plane of semiconductor layers of the semiconductor layer sequence during operation of the optoelectronic component;
wherein the emission region and the pump region are arranged between two cladding layers;
wherein the two cladding layers cause common transverse wave guidance of the pump radiation and the emission radiation; and wherein the emission radiation and the pump radiation propagate in the lateral direction.

2. The optoelectronic component as claimed in claim 1, during operation of which the pump region is electrically pumped, wherein charge carriers of one charge type are injected into the pump region through the emission region.

3. The optoelectronic component as claimed in claim 1, wherein at least one of the emission region and the pump region comprises a quantum structure, and wherein the emission region and the pump region respectively comprise a quantum layer, and a band gap of a semiconductor layer adjoining the quantum layer of the emission region is the same as a band gap of a semiconductor layer adjoining the quantum layer of the pump region.

4. The optoelectronic component as claimed in claim 1, wherein a charge carrier barrier is formed in the semiconductor body.

5. The optoelectronic component as claimed in claim 4, wherein the charge carrier barrier comprises a tunneling barrier.

6. The optoelectronic component as claimed in claim 4, wherein the charge carrier barrier is arranged between the emission region and the pump region.

7. The optoelectronic component as claimed in claim 1, wherein a distance between the emission region and the pump region is set such that a predefined portion of the pump radiation optically couples to the emission region.

8. The optoelectronic component as claimed in claim 1, wherein the emission region and the pump region are each provided in a vertical direction for operation in an optical mode of the same order.

9. The optoelectronic component as claimed in claim 1, wherein the emission region and the pump region are provided in a vertical direction for operation in optical modes having mutually different orders.

10. The optoelectronic component as claimed in claim 1, wherein at least one of the emission region and the pump region contains a III-V semiconductor material, in particular $Al_xIn_yGa_{1-x-y}N$, $Al_xIn_yGa_{1-x-y}Sb$, $Al_xIn_yGa_{1-x-y}As$ or $Al_xIn_yGa_{1-x-y}P$, in each case where $0 \leq x \leq 1$, $0 \leq y \leq 1$ and $x+y \leq 1$, or a III-V semiconductor material having a nitrogen content of at most 5%.

11. The optoelectronic component as claimed in claim 1, wherein the semiconductor body includes a radiation passage area configured such that it has a lower reflectivity for the emission radiation than for the pump radiation.

12. The optoelectronic component as claimed in claim 1, wherein the semiconductor body has a radiation passage area through which the emission radiation and pump radiation pass collinearly.

13. The optoelectronic component as claimed in claim 1, wherein the optoelectronic component further comprises a radiation receiver comprising a further semiconductor layer sequence, and wherein the semiconductor layer sequence and the further semiconductor sequence emerge from a common semiconductor layer sequence, such that a layer construction of the further semiconductor sequence and a layer construction of the semiconductor layer sequence having the pump region and the emission region are at least partially the same.

14. The optoelectronic component as claimed in claim 13, wherein an intensity of at least one of the emission radiation and the pump radiation are monitored by the radiation receiver.

15. The optoelectronic component as claimed in claim 13, wherein the emission region, the pump region of the semiconductor layer sequence and a radiation-sensitive region of the further semiconductor layer sequence are monolithically integrated.

* * * * *